(12) United States Patent
Motz et al.

(10) Patent No.: US 11,346,913 B2
(45) Date of Patent: May 31, 2022

(54) MAGNETIC FIELD SENSOR

(71) Applicant: Infineon Technologies AG, Neubiberg (DE)

(72) Inventors: Mario Motz, Wernberg (AT); Wolfgang Scherr, Villach Neulandskron (AT)

(73) Assignee: Infineon Technologies AG

( * ) Notice: Subject to any disclaimer, the term of this patent is extended or adjusted under 35 U.S.C. 154(b) by 448 days.

(21) Appl. No.: 16/571,991

(22) Filed: Sep. 16, 2019

(65) Prior Publication Data

US 2020/0011955 A1 Jan. 9, 2020

Related U.S. Application Data

(63) Continuation of application No. 15/053,809, filed on Feb. 25, 2016, now Pat. No. 10,502,806.

(30) Foreign Application Priority Data

Feb. 27, 2015 (DE) .......................... 102015102853.0

(51) Int. Cl.
*G01R 35/00* (2006.01)
*G01R 33/07* (2006.01)

(52) U.S. Cl.
CPC .......... *G01R 35/00* (2013.01); *G01R 33/075* (2013.01)

(58) Field of Classification Search
CPC ... G01R 33/07; G01R 33/0029; G01R 33/075
See application file for complete search history.

(56) References Cited

U.S. PATENT DOCUMENTS

| | | | |
|---|---|---|---|
| 5,406,202 A | 4/1995 | Mehrgardt et al. |
| 6,927,572 B2 | 8/2005 | Motz |
| 7,301,353 B2 | 11/2007 | Ausserlechner |
| 8,589,105 B2 | 11/2013 | Komasaki et al. |
| 9,164,155 B2 | 10/2015 | Ausserlechner |
| 2005/0134307 A1 | 6/2005 | Stojanovic et al. |
| 2009/0315549 A1 | 12/2009 | Hackner et al. |
| 2011/0199132 A1 | 8/2011 | Motz et al. |
| 2012/0095712 A1 | 4/2012 | Komasaki et al. |
| 2012/0239350 A1 | 9/2012 | Motz |
| 2013/0161391 A1 | 6/2013 | Schmalz et al. |
| 2013/0200909 A1 | 8/2013 | Rasbornig et al. |
| 2013/0222001 A1 | 8/2013 | Okatake et al. |
| 2013/0342194 A1 | 12/2013 | Motz et al. |
| 2014/0210458 A1 | 7/2014 | Ausserlechner |

(Continued)

FOREIGN PATENT DOCUMENTS

| | | |
|---|---|---|
| CN | 102445221 A | 5/2012 |
| CN | 103969606 A | 8/2014 |

(Continued)

*Primary Examiner* — Son T Le
*Assistant Examiner* — Adam S Clarke
(74) *Attorney, Agent, or Firm* — Design IP

(57) ABSTRACT

Devices and methods are provided where switches associated with a magnetic field sensor are used to provide error information. In particular, a device is provided that includes a magnetic field sensor, a plurality of switches associated with the magnetic field sensor, and a control circuit configured to control the plurality of switches and to provide at least one signal indicative of a fault based on operation of the switches.

20 Claims, 8 Drawing Sheets

(56) References Cited

U.S. PATENT DOCUMENTS

| | | | |
|---|---|---|---|
| 2014/0225596 A1 | 8/2014 | Nakamura et al. | |
| 2015/0070008 A1 | 3/2015 | Motz | |
| 2015/0081160 A1* | 3/2015 | Jecks | F02D 41/1482 701/31.1 |
| 2015/0256138 A1* | 9/2015 | Dasgupta | H03F 3/45179 330/255 |

FOREIGN PATENT DOCUMENTS

| | | |
|---|---|---|
| DE | 10204427 A1 | 8/2003 |
| DE | 102004021863 A1 | 12/2005 |
| DE | 102014113213 A1 | 3/2015 |
| EP | 548391 B1 | 7/1997 |

\* cited by examiner

MAGNETIC FIELD SENSOR

CROSS-REFERENCE TO RELATED APPLICATIONS

This application is a continuation of U.S. patent application Ser. No. 15/053,809, filed Feb. 25, 2016, which claims the benefit of German Patent Application No. 10 2015 102 853.0 filed Feb. 27, 2015, which are incorporated by reference as if fully set forth.

FIELD

The present disclosure generally relates to magnetic field sensors and to corresponding methods.

BACKGROUND

Magnetic field sensors are used in many applications to sense a magnetic field. For example, to detect a position or movement of a magnet may be mounted to a movable element like a pole wheel or a linear movable element. When the movable element moves, a magnetic field generated by the magnet varies, which may be detected by a magnetic field sensor. Such arrangements may, for example, be used to sense a position, velocity, a tampering of a magnetic field in smart meters or an acceleration.

Sometimes, such arrangements and magnetic field sensors are employed in safety critical applications, for example, in the automotive field. In such applications, reliable operation of the magnetic field sensor is important. Furthermore, in such applications it may be desired that faults of the magnetic field sensor are detectable, such that a system where the magnetic field sensor is used may recognize for example a fault of the magnetic field sensor.

In conventional approaches, sometimes redundant magnetic field sensors are provided, for example, a main magnetic field sensor and a possibly smaller auxiliary magnetic field sensor. The main magnetic field sensor and the auxiliary magnetic field sensor may be provided on a same chip die. In other approaches, two separate sensor dies may be assembled in a single package. Outputs of the main and auxiliary magnetic field sensors may be compared, and if they for example differ by more than a predetermined threshold value, this may indicate a fault condition.

However, while providing two sensors may help to fulfil functional safety requirements, providing two sensors also requires additional chip area and thus causes additional costs.

Therefore, alternative possibilities for obtaining information regarding a possible fault or other problem with a magnetic field sensor may be desirable.

SUMMARY

Devices and methods are provided where switches associated with a magnetic field sensor are used to provide error information. In particular, a device is provided that includes a magnetic field sensor, a plurality of switches associated with the magnetic field sensor, and a control circuit configured to control the plurality of switches and to provide at least one signal indicative of a fault based on operation of the switches.

DETAILED DESCRIPTION

Figure 1:
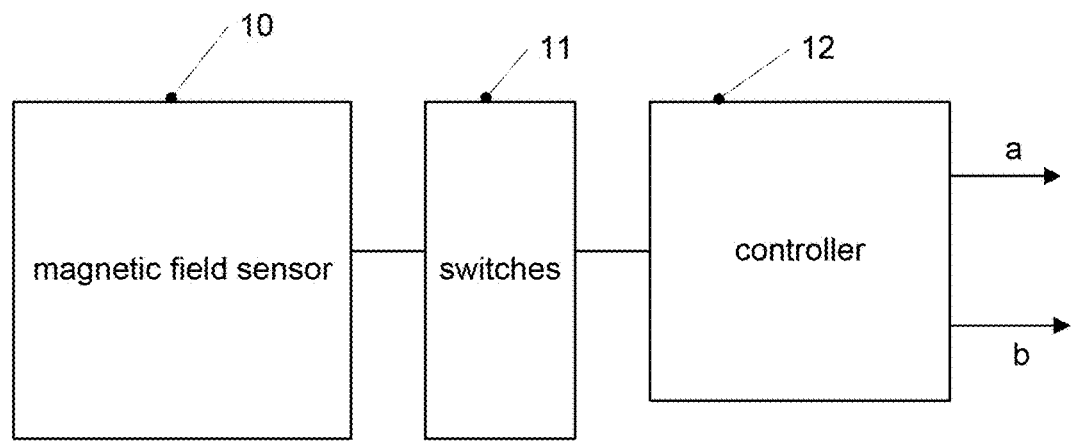
FIG. 1 is a block diagram illustrating a device according to one or more exemplary embodiments.

In the following, various exemplary embodiments will be described in detail referring to the attached drawings. These embodiments are given for illustrative purposes only and are not to be construed as limiting. For example, while embodiments may be described as comprising a plurality of features or elements, in other embodiments, some of these features or elements may be omitted, and/or may be replaced by alternative features or elements. In other embodiments, further features or elements in addition to those explicitly shown or described may be provided.

In exemplary embodiments described herein or shown in the drawings, any direct electrical connection or coupling, i.e., any connection or coupling without additional intervening elements, may also be implemented by an indirect connection or coupling, i.e., a connection or coupling with one or more additional intervening elements, or vice versa, as long as the general purpose of the connection or coupling, for example, to transmit a certain kind of signal or to transmit a certain kind of information, is essentially maintained. Features from different embodiments may be combined to form further embodiments. For example, variations or modifications described with respect to one of the embodiments may also be applicable to other embodiments unless noted to the contrary.

In one or more exemplary embodiments, a magnetic field sensor, such as a Hall sensor, may be associated with a plurality of switches. The switches may be used to implement a spinning current scheme for readout of the sensor. Furthermore, in one or more embodiments, information regarding faults occurring in the magnetic field sensor device may be obtained using the switches. Examples will be discussed later in greater detail.

A spinning current technique as used herein generally refers to a technique where various phases of different terminals of a magnetic field sensor are used for applying a current and for reading a measurement signal, for example, a voltage. Examples for spinning current techniques will be discussed later, for example, with reference to FIGS. 2-5.

Turning now to the figures, FIG. 1 illustrates a magnetic field sensor device according to an exemplary embodiment. The magnetic field sensor device of the embodiment of FIG. 1 comprises a magnetic field sensor 10. In one or more embodiments, magnetic field sensor 10 may comprise one or more Hall sensors, for example, planar or vertical Hall sensors. In case of a plurality of Hall sensors, such Hall sensors may be connected in parallel or in series. In other embodiments, other types of magnetic field sensors may be used, for example, sensors using a magnetoresistive effect (xMR sensors), for example, a tunneling magnetoresistive effect (TMR), a giant magnetoresistive effect (GMR), a colossal magnetoresistive effect (CMR) or an anisotropic magnetoresistive effect (AMR).

In the embodiment of FIG. 1, magnetic field sensor 10 is associated with a plurality of switches 11. Switches 11 may be controlled by a controller 12 to selectively apply, for example, a measurement current to selected terminals of magnetic field sensor 10, and/or to selectively measure a measurement signal, for example, a voltage, at selected terminals of magnetic field sensor 10. For example, switches 11 may be controlled by controller 12 to apply a spinning current technique, as will be discussed later in greater detail. Based on the measurements, controller 12 may output a signal a indicative of a magnetic field measured.

Furthermore, controller 12 may output a signal b which may be used to indicate or give information about a possible error or fault in the device of FIG. 1, for example, a fault of magnetic field sensor 10 or of switches 11. In one or more embodiments, controller 12 may to this end evaluate the measurements during different phases of a spinning current technique. In other embodiments, controller 12 may control switches 11 to perform specific tests to detect possible faults. Examples will be discussed later in greater detail.

It should be noted that while signals a and b are illustrated as separate signals in FIG. 1, in other embodiments only a single signal may be output. In such a case, for example, one or more specific values of the signals may be used to indicate a fault, whereas other values may indicate a measured magnetic field.

It should further be noted that the device of FIG. 1 need not be a unitary device, but, for example, part of the functions of controller 12 may be provided in a physically separate entity from the remaining functions, and communication between the entities may occur in a wire-based or wireless manner.

To provide a more thorough understanding of the exemplary embodiments, a spinning current technique in a magnetic field sensor device as usable in one or more embodiments will be explained with reference to FIGS. 2-5.

Figure 2:
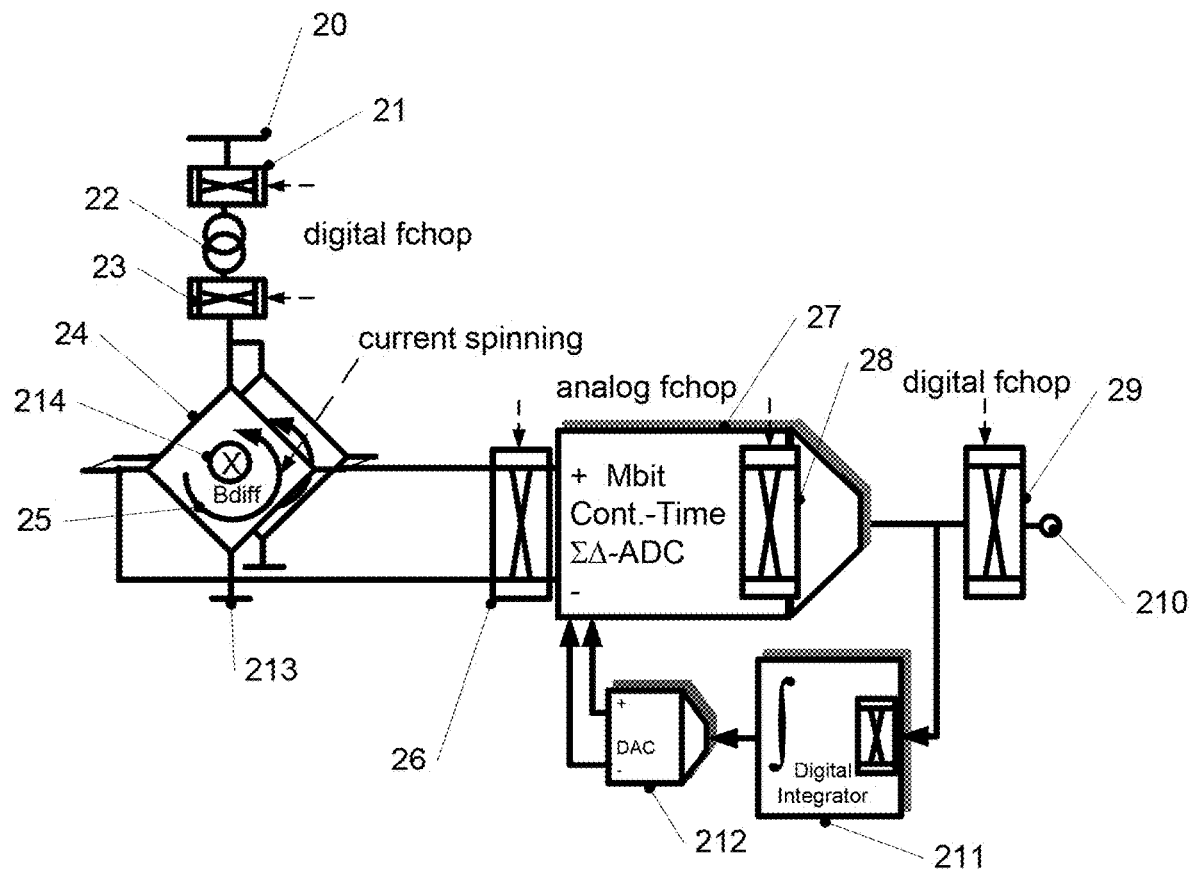
FIG. 2 is a block diagram illustrating a device configured to employ a spinning current technique.

FIG. 2 illustrates a magnetic field sensor device which may form the basis of one or more embodiments.

The magnetic field sensor device of FIG. 2 comprises a magnetic field sensor 24. Magnetic field sensor 24 may comprise one or more Hall sensors, for example, vertical or planar Hall sensors, but is not limited thereto. To give an example, in FIG. 2, two Hall sensors coupled in parallel are illustrated.

Via a current source 22, a bias current is applied to sensor 24. Numerals 20 and 213 indicate supply voltages. For example, numeral 20 may indicate a positive supply voltage, and numeral 213 may indicate ground.

The bias current generated by current source 22 in the embodiment may be chopped by choppers 21, 23 with a digital chopper frequency fchop.

A voltage, for example, a Hall voltage, at magnetic field sensor 24 in the embodiment of FIG. 2 is measured via an analog-to-digital converter. In the example of FIG. 2, the analog-to-digital converter comprises a sigma-delta analog-to-digital converter 27 with a feedback path comprising a digital integrator 211 and a digital-to-analog converter 212. However, in other embodiments, other kinds of analog-to-digital converters may be used, such as tracking converters, successive approximation converters, pipelined converters, flash converters or any combinations thereof, just to name a few non-limiting examples. The feedback path may be provided to compensate offset ripples. Analog choppers 26, 28 and a digital chopper 29 are provided and also operate with the chopping frequency fchop. Synchronously with the chopping, a spinning current technique may be applied as indicated by arrow 25. Numeral 214 indicates a magnetic field to be measured. The spinning current technique employs a technique for changing or rotating terminals of sensor 25 used for applying the bias current and terminals used for measuring a voltage, via the analog-to-digital converter, in each of a plurality of spinning current phases. For example, each of the plurality of spinning current phases may utilize a different set of terminals of sensor 25 for applying the bias current and for measuring a voltage.

A result of the magnetic field measurement may be tapped at node (e.g., output node) 210.

Such a spinning current technique will now be explained in more detail with reference to FIG. 3.

Figure 3:
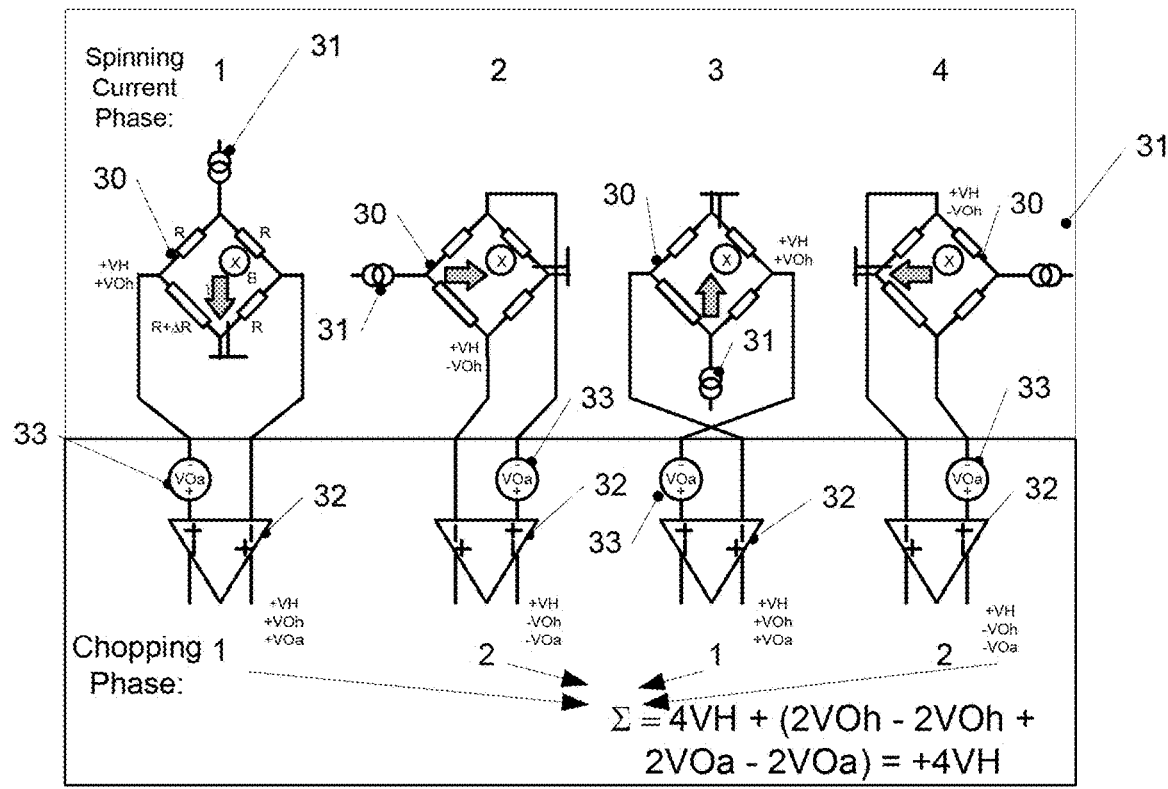
FIG. 3 is a diagram illustrating a spinning current technique.

FIG. 3 illustrates an example of a spinning current technique with four phases, labeled spinning current phase 1-4 in FIG. 3. Furthermore, in FIG. 3 two chopping phases are indicated. FIG. 3 shows a magnetic field sensor 30 for each of the chopping phases. For ease of reference and for illustration purposes, magnetic field sensor 30 is illustrated as a bridge with four resistors. For example, in one or more embodiments, sensor 30 may be a Hall sensor. In other embodiments, sensor 30 may be an xMR sensor using a bridge configuration. Magnetic field sensor 30 is used to measure a magnetic field B.

As can be seen in FIG. 3, the position where current source 31 is coupled to sensor 30 "rotates" or "spins" from phase to phase, hence the name spinning current.

An output signal of sensor 30 in the example of FIG. 3 is a Hall voltage VII which is amplified by a differential amplifier 32. In the example of FIG. 3, sensor 30 may have an (unintended) asymmetry. For example, one of the resistors illustrated may differ from the other resistors by a value ΔR. Such an asymmetry may be caused by an asymmetric sensor (for example asymmetric Hall plate) or may also be due to mechanical stress the sensor experiences.

This asymmetry causes an offset VOh of the Hall voltage VII. Addition of an amplifier offset VOa is symbolized by a voltage source 33 in FIG. 3, which is not a real voltage source, but merely represents the offset caused by the amplifier.

With the spinning current technique illustrated in FIG. 3, in spinning current phase 1 an output signal of amplifier 32 corresponds to +VII+VOh+VOa (i.e., chopping phase 1), in spinning current phase 2 the output signal corresponds to +VII−Voh−VOa (i.e., chopping phase 2), in spinning current phase 3 the output signal corresponds to +VII+VOh+VOa (i.e., chopping phase 1) and in spinning current phase 4 the output signal corresponds to +VII−Voh−VOa (i.e., chopping phase 2).

In a spinning current technique used in one or more embodiments, the results of all spinning current phases are added, yielding a result of 4 VH. The offsets cancel each other out. Therefore, by using the spinning current technique an offset compensated measurement may be obtained.

Figure 4:
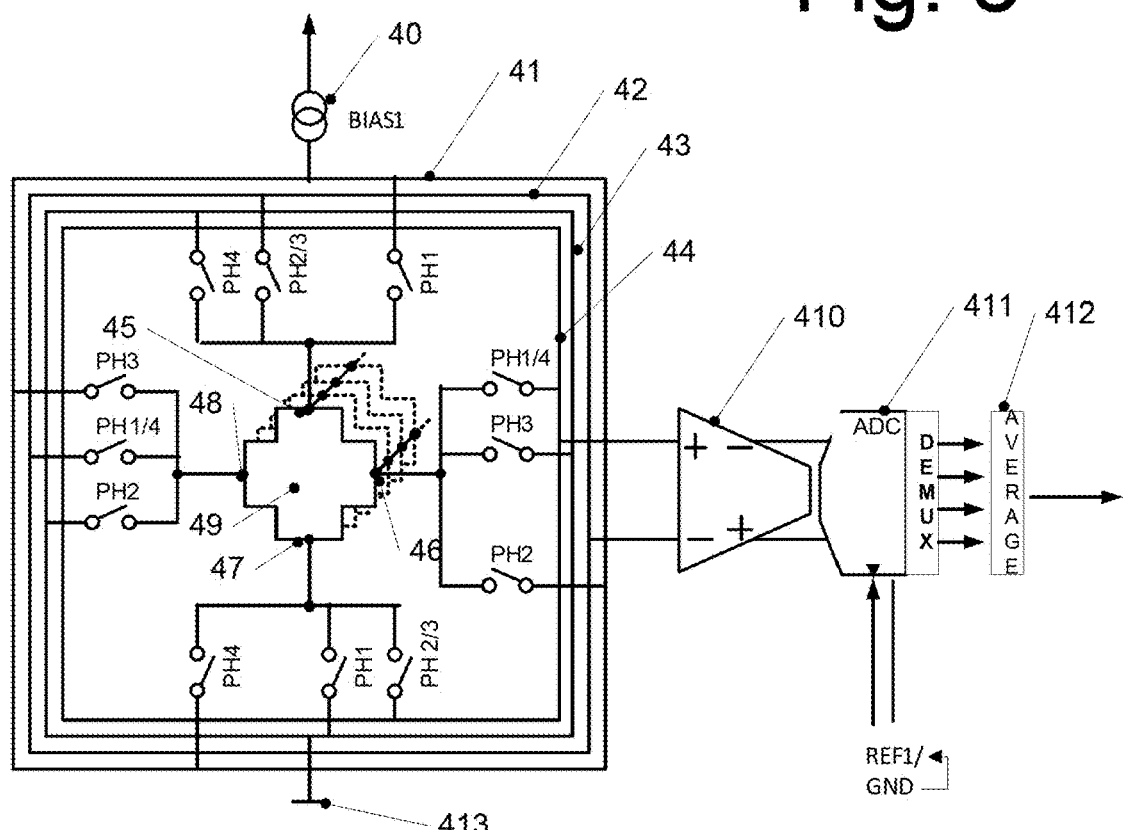
FIG. 4 is a circuit diagram of a magnetic field sensor device configured to employ a spinning current technique.

FIG. 4 illustrates an example implementation of a magnetic field sensor device employing a spinning current technique. The magnetic field sensor device of FIG. 4 may be used as a basis for various embodiments, some of which will be discussed later in greater detail. The device of FIG. 4 comprises a magnetic field sensor 49, for example, comprising a Hall plate or a plurality of Hall plates coupled in parallel. In other embodiments, other types of magnetic field sensors may be used. Magnetic field sensor 49 in the example of FIG. 4 comprises four terminals 45-48. In each phase of a spinning current technique, for example, two terminals of sensor 49, such as two terminals on two opposite sides, may be used for applying a bias current, and two other terminals of sensor 49, for example, two other terminals on opposite sides, may be used to measure a voltage like a Hall voltage.

To implement a spinning current scheme, the embodiment of FIG. 4 comprises four electrical conductors 41-44 which in the example of FIG. 4 surround magnetic field sensor 49. In other embodiments, other topographies of conductors 41-44 may be used. Conductor 41 is coupled with a current source 40 supplying a bias current. Conductor 42 is coupled with a negative input of a differential amplifier 410. Conductor 43 is coupled with ground 413. Conductor 44 is coupled with a positive input of differential amplifier 410.

Terminals 45-48 as illustrated in FIG. 4 are coupled to conductors 41-44 via switches PH1-PH4. In a first phase of a spinning current technique, switches PH1 are closed and the remaining switches PH2-PH4 are open. In the second phase, all switches PH2 are closed, and the remaining switches are open. In a third spinning current phase, all switches PH3 are closed, and the remaining switches are open. A labelling of switches like PH1/3 or PH2/4 indicates switches that are closed in two phases, e.g. phases 1 and 3 for PH1/3 and phases 2 and 4 for PH2/4. For ease of reference, these switches are included when referring to switches PH/1-PH/4. In a fourth spinning current phase, all switches PH4 are closed, and the remaining switches are open. Therefore, as illustrated in FIG. 3, by selectively opening and closing switches PH1 to PH4 terminals 45-48 are either used as biasing terminals for supplying a bias current or as measurement terminals for measuring a voltage via differential amplifier 410. The topography illustrated in FIG. 4 serves merely as an example, and other arrangements of the switches and conductors may be used as well.

An output of differential amplifier 410 is provided to an analog-to-digital converter 411, which is provided with a reference voltage REF1 and/or ground as a reference. As indicated by "DEMUX", the analog-to-digital converter 411 provides outputs for the four spinning current phases to an averager 412, which provides an average and/or sum of the phases, possibly over a plurality of cycles, which is indicative of a magnetic field with compensated offsets, as explained with reference to FIG. 3.

While four phases are illustrated in FIGS. 3 and 4 and also in embodiments to be described later, this is not to be construed as limiting, and techniques disclosed herein may also be applied to a different number of phases, in particular more than four phases (e.g., six phases, eight phases, etc.), but may also be applicable to spinning current techniques using only three phases.

Figure 5:
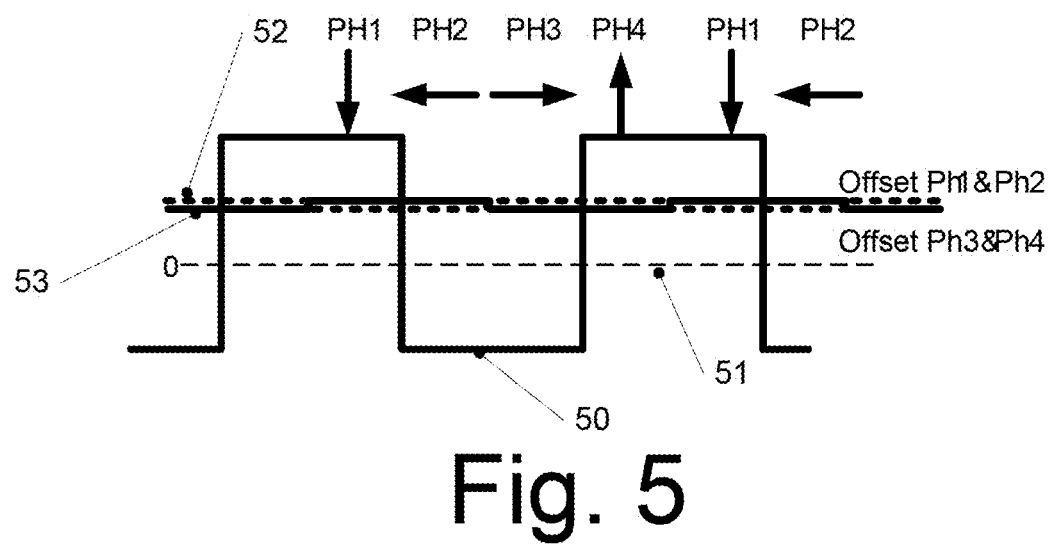
FIG. 5 illustrates example signals at an output of an analog-to-digital converter for the magnetic field sensor of FIG. 4.

FIG. 5 illustrates an averaging effect through the use of a spinning current technique as employed in embodiments using example signals. The signals of FIG. 5 are given for illustration purposes only, and in other embodiments other signal waveforms may be used.

Arrows in FIG. 5 illustrate a direction of current (biasing current) in phases PH1-PH4. A curve 50 shows an example for a measurement result including an offset occurring in a signal measured in individual ones of the spinning current phases. Curve 51 designates a zero value. Curve 52 illustrates an effect of an offset when summing results of spinning current phases 1 and 2, and curve 53 illustrates an effect of an offset when summing results for spinning current phases 3 and 4. As can be seen, the offset in curves 52 and 53 is already greatly reduced compared to the offset as occurring in curve 50. Furthermore, the offset according to curve 53 has the opposite behaviour than the offset according to curve 52, and through averaging curves 52 and 53 the effect of the offset may be further cancelled out. The fact that the offset is already cancelled out to a great extent when summing only two adjacent phases is used in one or more embodiments to detect faults, as will be explained below.

Next, with reference to FIGS. 6-9, various embodiments of magnetic field sensor devices will be discussed. The magnetic field sensor devices of FIGS. 6 through 9 for illustrative purposes are based on the magnetic field sensor device of FIG. 4, and like reference numerals are used to designate similar or corresponding elements which will not be described repeatedly for conciseness sake.

Figure 6:
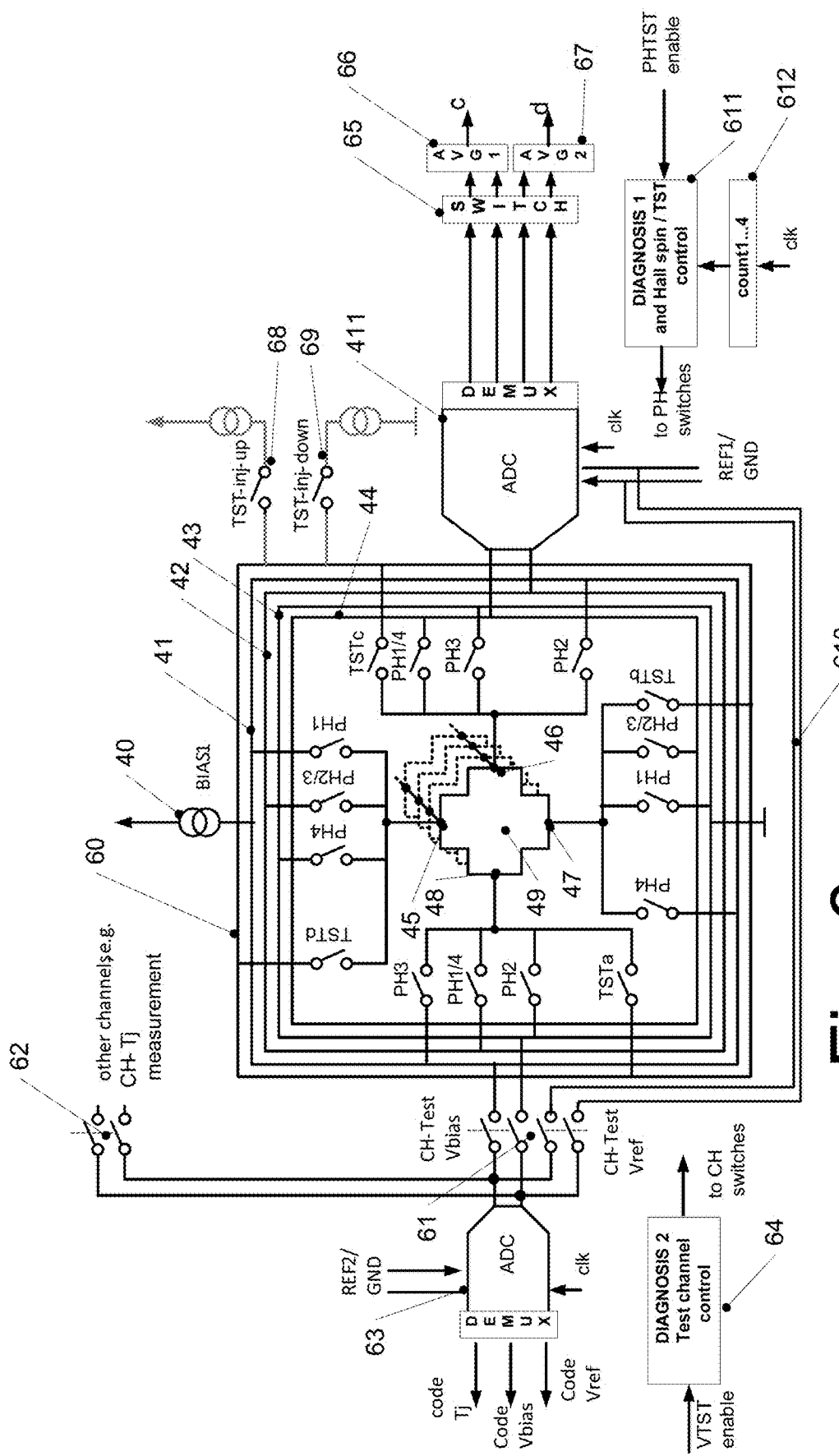
FIG. 6 illustrates a magnetic field sensor device according to one or more exemplary embodiments.

FIG. 6 illustrates a magnetic field sensor device according to an embodiment. In the embodiment of FIG. 6, a magnetic field sensor 49, for example a Hall sensor, is provided similar to FIG. 4, which may be selectively coupled to conductors 41-44 via switches PH1-PH4 to implement a spinning current technique as described above. In addition to measuring a magnetic field using a spinning current technique as described above, the device of FIG. 6 may provide various diagnosis functions for example to be able to detect errors, faults or failures in the magnetic field sensor device. While a plurality of different diagnosis functions will be described with reference to FIG. 6 and with reference to other embodiments, it is to be understood that this is not to be construed as limiting, and other embodiments may implement only one or some of the diagnosis functions described.

One example of a diagnosis function which may be implemented in the embodiment of FIG. 6 is based on providing partial sums over only some of the results of the spinning current phases. As explained above with reference to FIG. 3, in a spinning current technique with four phases, the four phases may be summed to cancel out offsets. In the embodiment of FIG. 6, a switch 65 may provide signals, e.g., the signals of the first two phases of a four phase spinning current technique, to a first averager 66, and outputs signals, e.g. the outputs from the third and fourth phases, to a second averager 67. Averagers 66, 67 may be used to form an average of the supplied signals in one or more embodiments, and the average may be formed over more than one measurement cycle, where one measurement cycle comprises four phases in the example shown. In other embodiments, averagers 66, 67 may form an average over signals from different phases in one measurement cycle.

For example, the first averager 66 may output an average of the measurement results from a first and second spinning current phases as illustrated in FIG. 6, and the averager 67 may output the average of a sum of the measurement results of the third and fourth spinning current phases as illustrated in FIG. 3 as signal d. As explained with reference to FIG. 5 above, already for two adjacent phases (e.g., 1 and 2 or 3 and 4) the offsets essentially cancel each other out. Therefore, in an error-free operation, signal c should approximately be equal to signal d (as an example, see signals 52, 53 of FIG. 5). If a difference between signals c and d is more a predetermined threshold value, this may indicate a fault, for example, a fault of one or more of the switches involved. Therefore, according to the embodiments, by providing two partial sums instead of a sum over all spinning current phases, an error detection may be implemented.

It should be noted that in one or more embodiments, switch 65 may be configured to change the partial sums. For example, as mentioned above, signal c may correspond to a sum of spinning current phases 1 and 2 of FIG. 3, and signal d may correspond to a sum of spinning current phases 3 and 4 in an example embodiment. In one or more embodiments, switch 65 may then change the signals provided to averagers 66, 67 such that for example signal c is a sum of the results of spinning current phases 1 and 4 of FIG. 3, and signal d is the result of spinning current phases 2 and 3. Also with this summing, signals c and d may be compared, and if they differ by more than a predetermined threshold this may indicate an error, for example, a malfunctioning of one or more of the switches. By providing different partial sums as explained above, additional redundancy may be provided.

Furthermore, by outputting signals c and d to another entity, for example, a system, in error-free operation redundancy may also be obtained in one or more embodiments, as each of signals c and d at least approximately provides a correct value. By providing such redundancy, functional safety may be increased.

Additionally or alternatively, a different summing of the results from spinning current phases may be performed in one or more embodiments to obtain a value of the offset. While in normal spinning current mode as indicated in FIG. 3 the summing is performed to cancel out the offset and to obtain the Hall voltage, for testing or diagnosis purposes the sum may be formed such that the Hall voltage (or other voltage to be measured) is cancelled out, and only the offset is measured. In the example of FIG. 3, this may for example be obtained by subtracting instead of adding the signals output by analog-to-digital converter 411 in phases 2 and 4 in the overall sum, such that for these phases the output result is essentially −VII+Vah+VOa in the example of FIG. 3. Summing the results of all phases then yields 4 VOh+ 4VOa, i.e., a measure of the offset. The offset may for example be compared with a predetermined threshold in one or more embodiments. An offset above a threshold may for example indicate faults like high leakage currents of switches PH1 . . . PH4 and/or cases where one of the switches is defective and for example cannot close or remains closed all the time.

Controlling of the switches both for spinning current mode and for such a diagnosis to obtain the offset may be performed by a controller 611, which is controlled by a counter 612 which counts from 1 to 4 for four spinning current phases. A mode of operation may be determined by a PHTST enable signal. For example, a mode of operation may be switched between a regular spinning current mode where the Hall voltage is determined and a test mode where the offset is determined as explained above. Counter 612 may be clocked by a clock signal clk. Furthermore, in a test mode switches PH1 . . . PH4 and additional switches TSTa to TSTd may be controlled as explained below.

Furthermore, an additional conductor 60 may be provided, which may be selectively coupled with terminals 45-48 of magnetic field sensor 49 via test switches TSTa to TSTd as illustrated in FIG. 6. Furthermore, conductor 60 may be selectively coupled to current sources via switches 68, 69 as illustrated in FIG. 6. This coupling of conductor 60 to current sources together with closing of respective switches TSTd may be used to inject error currents to the device of FIG. 6. Injecting error currents in one or more embodiments may be used to check if diagnosis functions provided operate correctly. For example, injecting an error current via one of the switches TSTa to TSTd should lead to an error being detected by evaluating signals c and d as explained above. If no error is detected, this may indicate a fault of the diagnosis function.

In one or more embodiments, such injection tests where an error current is injected may be performed only on startup, which will provide at least some latent fault diagnosis. In other embodiments, such injections tests additionally or alternatively may be performed during runtime, e.g., during actual use of a sensor device. In such a case, the injection tests may be properly handled in an additional measurement phase (e.g., by testing one switch TSTa to TSTd each overall measurement cycle to give a non-limiting example).

Furthermore, in one or more embodiments, injecting a current via switch 68 or via switch 69 may be used to detect short circuits or leakage currents. For example, via the switches PH1-PH4 and TSTa-d, an error current may be provided to any of conductors 41-44 and should not occur on any of the other conductors in case the conductors are correctly insulated from each other.

For further testing purposes, in one or more embodiments switches 61 may be provided which may be used to couple a further analog-to-digital converter 63 either with one of connectors 41, 43 or with a reference input of analog-to-digital converter 411 via connectors 610. Further analog-to-digital converter 63 may be an analog-to-digital converter provided also for other purposes as indicated by switches 62, for example, for temperature measurement. In one or more embodiments, analog-to-digital converter 63 may be used to perform additional test procedures besides measuring temperature. By using an analog-to-digital converter 63 already provided for other purposes like temperature measurements also for providing diagnosis functions for the magnetic field sensor device, chip area in one or more embodiments may be saved compared to a case where an additional analog-to-digital converter is provided.

Switches 61 and 62 may be controlled by a controller 64 (which is depicted separately from controller 611 in FIG. 6, but which may also be implemented in a single controller with controller 611), to selectively provide signals to analog-to-digital converter 63. As indicated by a demultiplexer DEMUX, analog-to-digital converter 63 then may output various signals depending on a test being performed. Controller 64 may be controlled by a VTST enable signal to select a test or measurement to be performed.

In the embodiment of FIG. 6, analog-to-digital converter 63 uses a different reference/biasing voltage (labelled REF2/GND in FIG. 6) than analog-to-digital converter 411. Therefore, via conductor 610 and respective switches 61, in one or more embodiments analog-to-digital converter 63 may measure the reference voltage of analog-to-digital converter 411 and may output a corresponding indication (labelled Code Vref in FIG. 6). In this way, in one or more embodiments, the reference voltage of analog-to-digital converter 411 may be tested. Moreover, by closing appropriate switches 61 coupled with conductors 41, 43, the biasing voltage between conductors 41, 43 generated by biasing current source 40 may be measured and output (labelled Code Vbias in FIG. 6). In this way, embodiments may test if a correct biasing for Hall sensor device 49 is provided.

Such diagnosis functions may for example be performed as a start-up test or cyclic or at diagnosis test signal provided by a system (e.g., in case any anomaly was detected to do a full system check before entering any failure state) or in parallel to normal operation using additional analog-to-digital converters (or simplified comparators or even window comparators which can be seen as analog-to-digital converters with one or two bit output).

When switches 62 are closed and switches 61 are open, analog-to-digital converter 63 may for example measure a temperature and output the result as a signal labelled Code Tj (which in this embodiment may refer to a chip junction temperature, but may also comprise any other temperature to be measured in a particular application). This temperature measurement is merely an example for any further measurement analog-to-digital converter 63 may be used to perform. Such temperature measurements or other measurements may for example be used for trimming/calibration of the magnetic field sensor.

Other embodiments may alternatively or additionally measure stress dependent channels, chip cracks with resistive loops, pressure, light, electric fields, internal or external (known) voltages or any other physical property required by a particular application (directly or indirectly), e.g., for trimming and/or calibration purposes, or to take advantage of sharing an analog-to-digital converter like converter 63 in a system approach to measure any additional physical quantities related or not related to the magnetic field measurement. In one or more embodiments, a converter like converter 63 may additionally or alternatively be used to perform a redundant magnetic field measurement in addition to the result of converter 411 using an additional Hall sensor in addition to the setup comprising Hall sensor 49 (e.g. to provide a measurement with a certain distance to Hall sensor 49, e.g., to measure a magnetic background field).

Furthermore, a redundant magnetic field measurement may in one or more embodiments use a different measurement principle (e.g., using a magneto-resistive sensor (e.g., GMR, TMR or xMR in general) instead of an additional Hall probe. Such a magnetoresistive sensor may again be connected via multiplexing switches to analog-to-digital converter 63. This may further be used in one or more embodiments to improve the independence of the redundant measurement setup (e.g., diversity of measurements: H-fields versus B-fields).

It should be noted that in other embodiments, additionally or alternatively, Hall sensors with sensitivity in other directions (lateral or vertical Hall sensors) using the same principle as described here may be used. This also applies to Hall sensor 49.

The above diagnosis functions, singly or in combination with each other, may improve the single point fault metric for the device shown as well as a latent fault metric for safety systems requiring magnetic field sensors like the Hall sensor devices shown. As already mentioned, while in the embodiment of FIG. 6 a plurality of different diagnosis functions are implemented and have been described above, only one or some of these functions may be implemented in other embodiments. For example, if a reduced redundancy is sufficiently given by the safety analysis, both ADC can even use the same reference voltage and thus the connection 610 and the corresponding multiplexing is no longer needed.

It shall be mentioned that it may be also desired in a particular application to implement an even more diverse setup by using different techniques to implement the reference voltages, e.g., a bandgap-based principle versus a poly-resistor based principle (which may need additional trimming) just to name two examples. The setup shown in the embodiment of FIG. 6 provides a highly flexible setup for providing a diverse implementation.

The same principles may apply to the selection of the analog-to-digital converters. For example, for diversity purposes different principles for the converters 411 and 63 may be used in embodiments to improve robustness against common-cause faults in the design (or even systemic faults during the implementation). Due to economic reasons it might not be desirable to use more than two converters in some cases, but if desired, e.g., for safety purposes other embodiments may use additional converters instead of multiplexing the input of converter 63 (e.g. for the purpose of parallel measurements to reduce a fault detection time). In other embodiments, channels (analog signals) converted by analog-to-digital converter 63 (like the junction temperature channel 62) in the embodiment of FIG. 6 may be converted in other embodiments by converter 411 (using an additional multiplexer on its input). Generally, by using such multiplexers different quantities may be measured/converted in different operating phases of an analog-to-digital converter.

Figure 7:
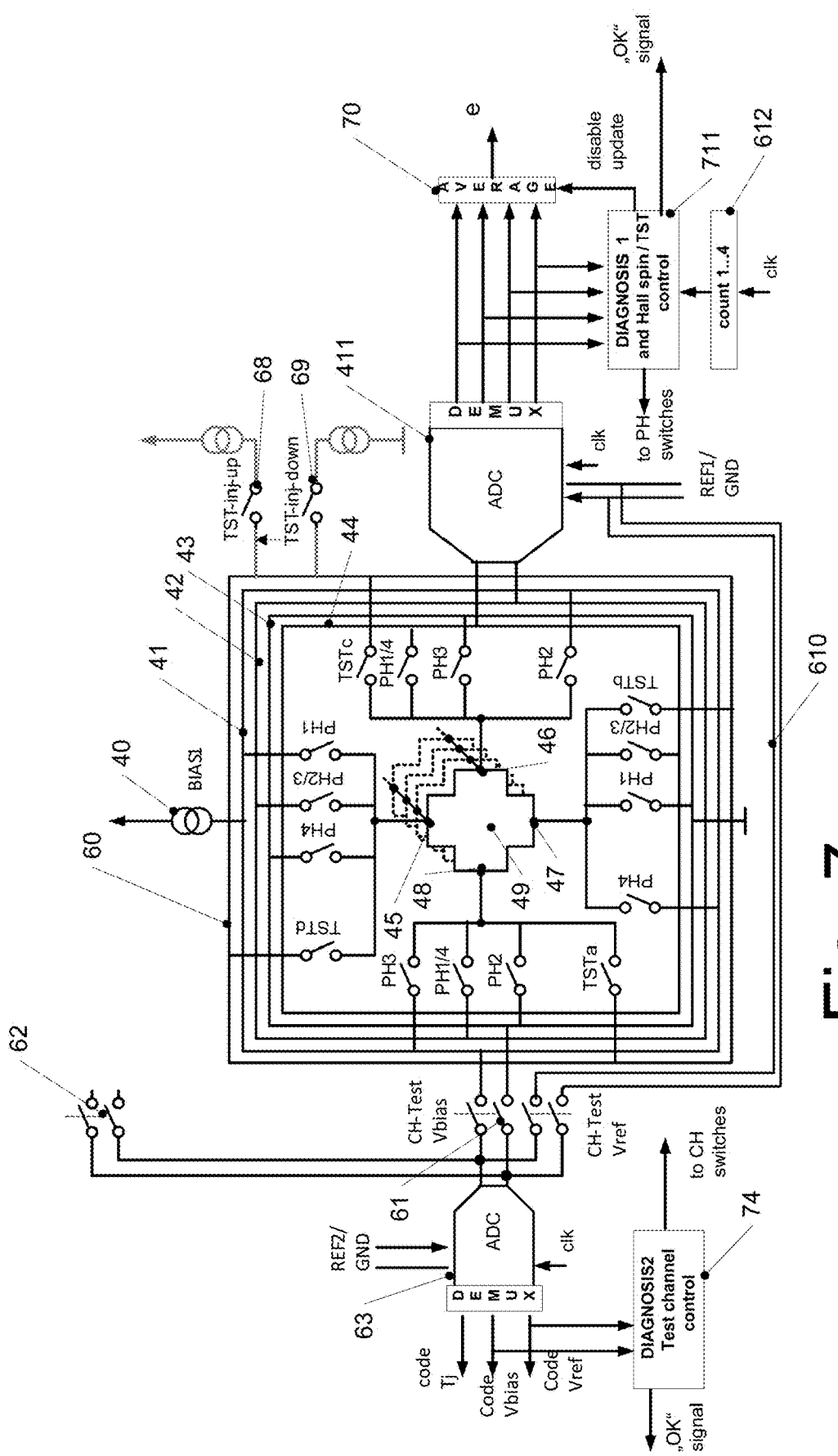
FIG. 7 illustrates a magnetic field sensor device according to one or more exemplary embodiments.
Figure 8:
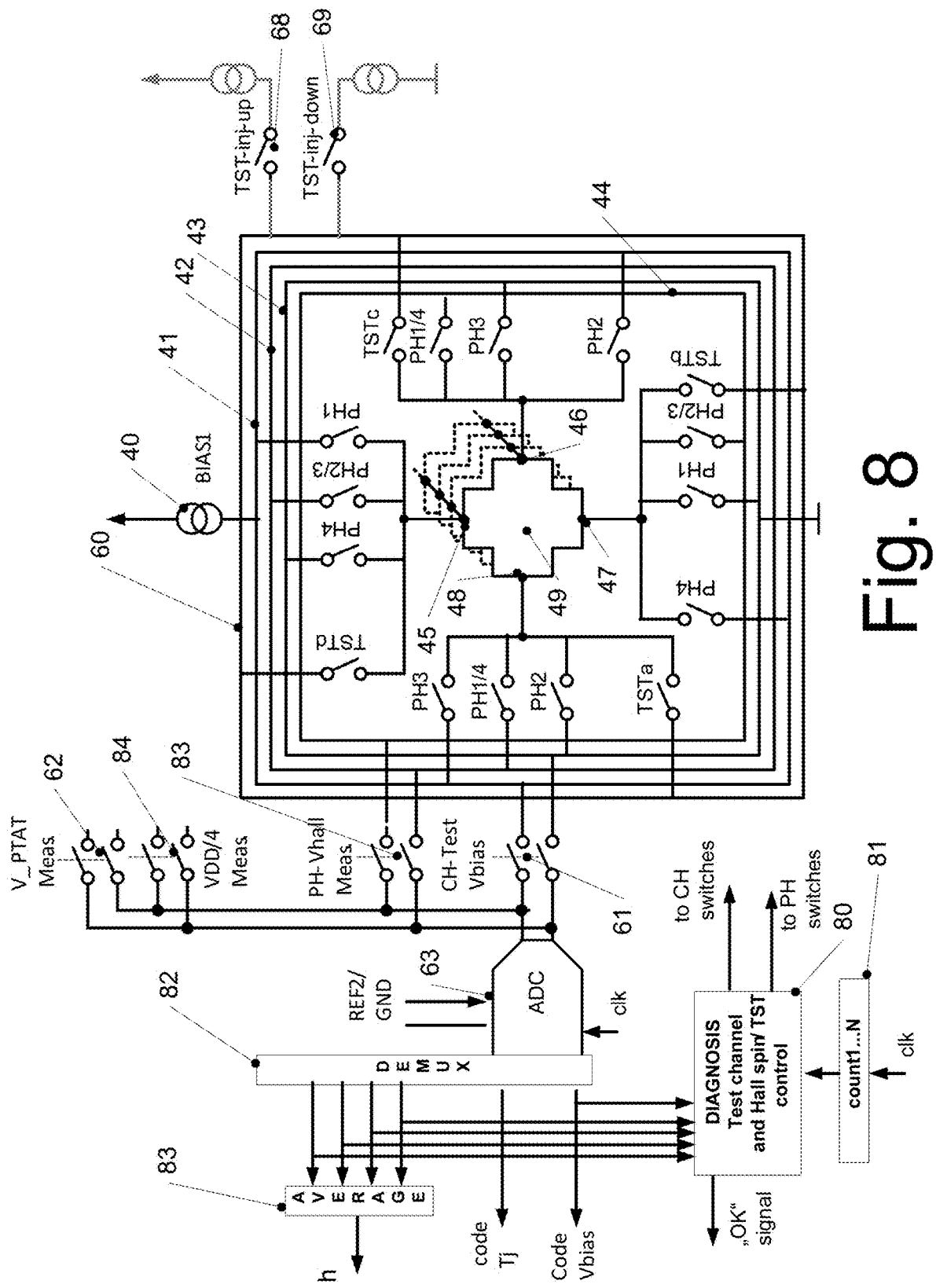
FIG. 8 illustrates a magnetic field sensor device according to one or more exemplary embodiments.
Figure 9:
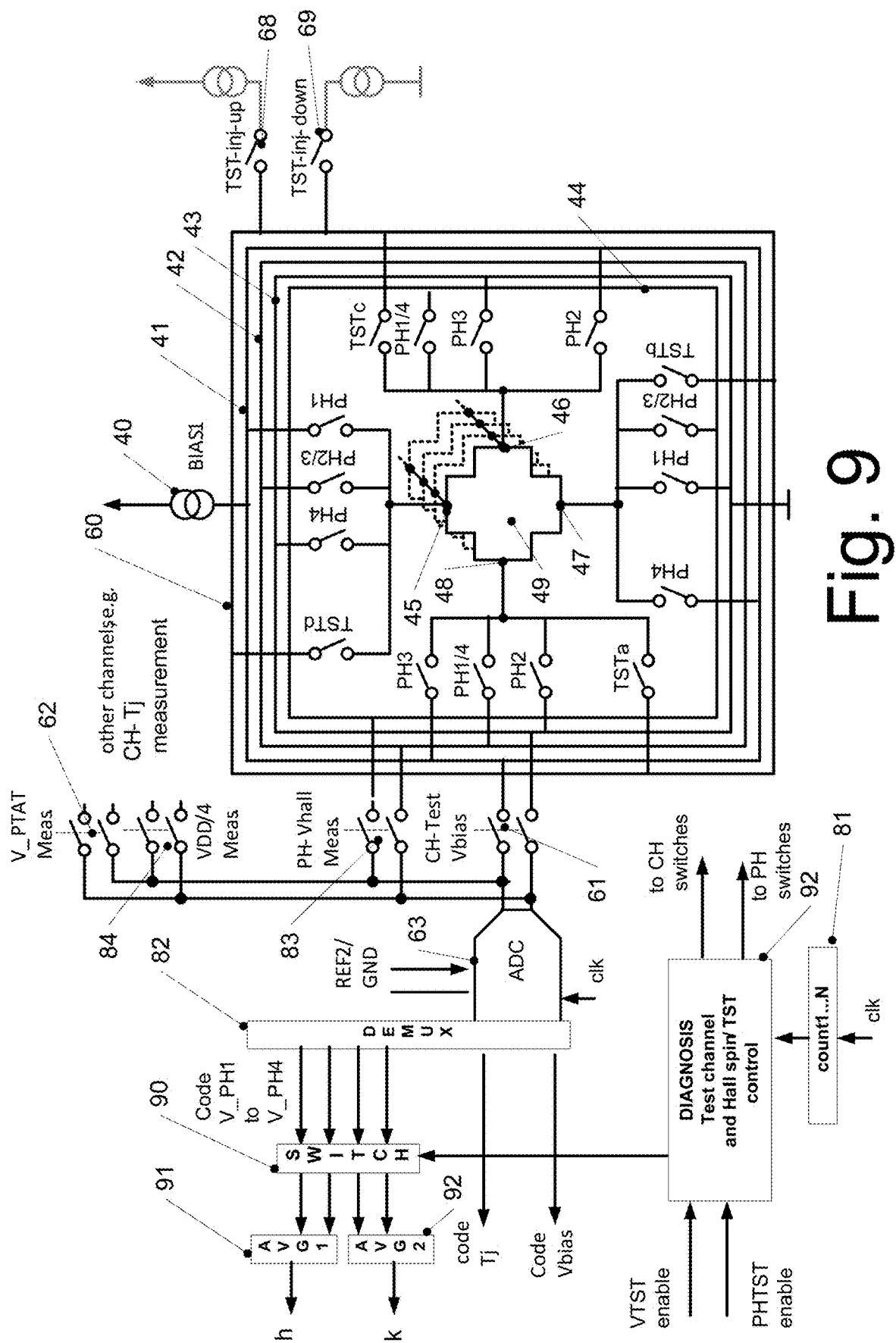
FIG. 9 illustrates a magnetic field sensor device according to one or more exemplary embodiments.

Next, with reference to FIGS. 7-9, various modifications to the embodiment of FIG. 6 may be described. To avoid repetitions, like elements bear the same reference numerals, and only the differences or modifications compared to the embodiment of FIG. 6 will be described in greater detail.

In the embodiment of FIG. 6, the diagnosis at least in part may occur outside the sensor device in case a very high independency of a diagnosis is needed. For example, if signals c and d differ from each other by more than a threshold value, the evaluation may be performed by an external entity. Likewise, if the signals code Vbias and code Vref indicate an error, an evaluation may be made by an external entity.

For example, in a case where the system already requires a second physically separated sensor IC, the diagnosis and independency requirements could be reduced to implement a more economic single sensor setup used twice in the system. A lower required safety level of a particular application as such also could cause that the requirements for independence can be reduced. For example, in such cases, the setup as shown in the embodiment of FIG. 6 could be further simplified, as shown in FIGS. 7-9.

In the embodiment of FIG. 7, an evaluation of the diagnosis occurs solely within the sensor device shown. If, for example, the sensor device is implemented on a single chip, this may allow for an on-chip analysis.

In the embodiment of FIG. 7, instead of controller 611 of FIG. 6, a controller 711 is provided. Furthermore, instead of controller 64, a controller 74 is provided.

Furthermore, in the embodiment of FIG. 7, a single averager 70 is provided instead of averagers 66, 67 of FIG. 6. Averager 70 forms a sum over the output signals of analog-to-digital converter 411 for all four phases of a spinning current technique, or even an average over a plurality of measurement cycles, and outputs the same as signal e. Signal e therefore provides a measure for the magnetic field measured by sensor 49. Furthermore, the outputs for the four phases are provided to a controller 711. Controller 711 may perform functions as described with respect to FIG. 6 for signals c and d, i.e., controller 711 may form partial sums (for example of the first and second phases and the third and fourth phases) and evaluate if a difference between the partial sums is greater than a threshold value. Furthermore, controller 711 may combine the signals for the four phases to determine the offset, as described with respect to FIG. 6, and evaluate the result. In case the result does not indicate an error, controller 711 may output an "OK" signal indicating that no fault was detected. In other embodiments, additionally or alternatively, controller 711 may output an error signal indicating that an error or fault was detected.

In case controller 711 detects an error condition, controller 711 may control averager 70 to disable updating, such that the signal e is frozen, or may control averager 70 to output a value of signal e indicating an error. In the latter case, outputting the "OK" signal separately may be omitted.

Moreover, in the embodiment of FIG. 7, controller 74 evaluates the signals Code Vref and Code Vbias to determine if a biasing provided by current source 40 and a reference signal supplied to analog-to-digital converter 411 is correct. In case of no error, an "OK" signal may be output, and/or in case of an error or fault, an error signal may be output. It should be noted that the signals output by controllers 74, 711 (e.g., "OK" signal) may be provided at a common output, for example, using a logic gate combining the signals.

Otherwise, operation of the embodiment of FIG. 7 may be as described for the embodiment of FIG. 6. It should be noted that in some embodiments, only controller 711 or only controller 74 may be provided, and the respective other controller may operate as discussed with reference to FIG. 6.

FIG. 8 illustrates a further embodiment. In the embodiment of FIG. 8, compared to the embodiment of FIG. 6, analog-to-digital converter 411 is omitted, and analog-to-digital converter 63 is additionally used to perform the Hall voltage measurement using a spinning current technique and/or the offset measurement. To this end, additional switches 83 are provided which enable a measurement of the Hall voltage via analog-to-digital converter 63. A demultiplexer 82 coupled to analog-to-digital converter 63 serves to output signals measured by closing switches 61, 83, 84 and 62 to corresponding output connections. Measurement results of a spinning current technique (switches 83 closed) are provided to an averager 83, which provides the sum over all four phases or an average sum over a plurality of measurement cycles and outputs the same as signal h. Signal h therefore provides a measure for the magnetic field measured by the magnetic field sensor.

A controller 80 serves to provide the diagnosis functions discussed above by evaluating the signals output by the spinning current scheme (for example by providing partial sums as discussed above), for calculating the offset by evaluating the Code Vbias signal which is obtained when switches 61 are closed. Furthermore, in embodiments analog-to-digital converter 63 via switches 84 may measure an internal generated or external voltage (e.g., a divided supply voltage VDD/4 as shown or any other known voltage from the system). This again may improve the diagnosis of the converter and reference 63 (especially if more than one voltage level can be measured) in one or more embodiments.

Controller 80 also controls switches PH1-PH4, TSTa-d and switches 61, 83, 84 and 62. To perform this control, controller 80 is supplied by a counter 81 which counts from 1 to N. N in the embodiment of FIG. 8 may be 4 for four spinning current phases plus a number of additional measurement phases for diagnosis functions, for example, a diagnosis with switches 61 closed to measure the biasing current or measurements with an error current injected, as described previously.

If no error occurs, controller 80 may output an "OK" signal, and/or if an error is detected, controller may output an error signal.

FIG. 9 illustrates a magnetic field sensor device according to a further embodiment. The embodiment of FIG. 9 is to some extent a combination of the embodiments of FIGS. 6 and 8. Similar to the embodiment of FIG. 8, in the embodiment of FIG. 9, a single analog-to-digital converter 63 is used. Similar to the embodiment of FIG. 6, a controller 92 controls switching of the switches based on PHTST enable signal for the switches PH1-PH4 and TSTa-TSTd and based on VTST enable signal for switches 61. Also, similar to the embodiment of FIG. 6, the evaluation is performed external to the device shown. For example, the output signals relating to the four spinning current phases are provided from demultiplexer 82 to a switch 90 controlled by controller 92, which provides the signals to a first averager 91 and a second averager 92. The function of first and second averagers 91 and 92 is the same as the function of averagers 66, 67 of FIG. 6, namely to provide two signals h, k which may each be representative of a partial sum over the output results of the individual spinning current phases.

Switch 90 may be controlled by controller 80 for example to change the way the partial sums are calculated, as also explained previously with respect to FIG. 6 (for example, summing phases 1 and 2 to obtain signal h and phases 3 and 4 to obtain signal k, or summing signals from phases 1 and 4 to obtain signal h and from phases 2 and 3 to obtain signal k).

FIG. 9 illustrates therefore that features from different embodiments may be combined to form further embodiments, and other features from various embodiments may also be combined to form further embodiments.

With the diagnosis functions discussed, in some embodiments provision of a secondary sensor to provide redundancy may be omitted while still maintaining a high level of functional safety. In other embodiments, the magnetic field sensor devices discussed previously may be combined with a further magnetic field sensor device (either conventional or as described) to provide both redundancy and the diagnosis functions discussed previously.

Magnetic field sensor devices as discussed above may for example be used in an automotive environment, but are not limited thereto. An example environment is illustrated in FIG. 10.

Figure 10:
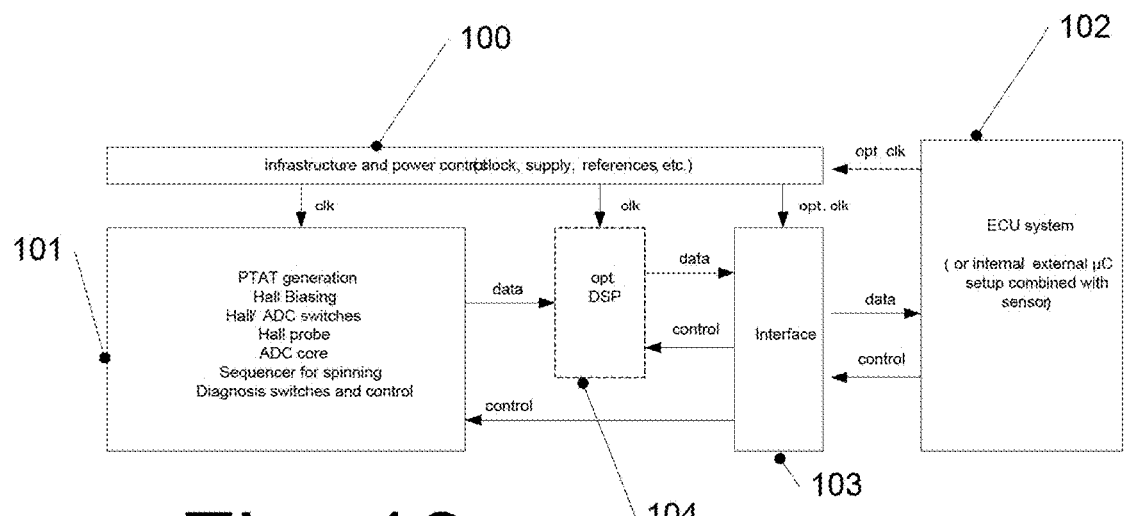
FIG. 10 illustrates an example environment for magnetic field sensor devices according to one or more exemplary embodiments.

A system shown in FIG. 10 comprises a magnetic field sensor device 101, which may be implemented as discussed previously with reference to FIGS. 1-9. Magnetic field sensor device 101 is supplied for example with a clock signal clk and/or with supply voltages or reference voltages by a supply device 100. Supply device 100 may comprise any conventional circuitry for providing supply voltages and/or for providing clock signals. Supply device 100 may also provide supply voltages and clock signals to other devices of the system of FIG. 10.

The system of FIG. 10 is controlled by an electronic control unit (ECU) system 102, for example, an ECU of a car. In alternative embodiments, the system may be controlled by any kind of microcontroller, which may be integrated with magnetic field sensor device 101 or may be provided external to magnetic field sensor device 101.

ECU system 102 controls magnetic field sensor device 101 via an interface 103. For example, ECU system 102 may provide signals like the above discussed signals VTST enable and PHTST enable in case of an external diagnosis control. Conversely, ECU system 102 receives data from magnetic field sensor device 101 via interface 103 and optionally via a digital signal processor 104. Digital signal processor 104 in one or more embodiments may provide evaluation of the signals provided by magnetic field sensor device 101 for diagnosis functions, for example, based on signal c, d, code Vbias and code Vref of FIG. 6. In other embodiments, such an evaluation may be performed by ECU system 102. In yet other embodiments, for example, as described with reference to FIGS. 7 and 8, such an evaluation may be provided internally in magnetic field sensor device 101.

The system of FIG. 10 is merely an example environment, and magnetic field sensor devices as described herein may generally be used in application where a magnetic field is to be measured.

Figure 11:
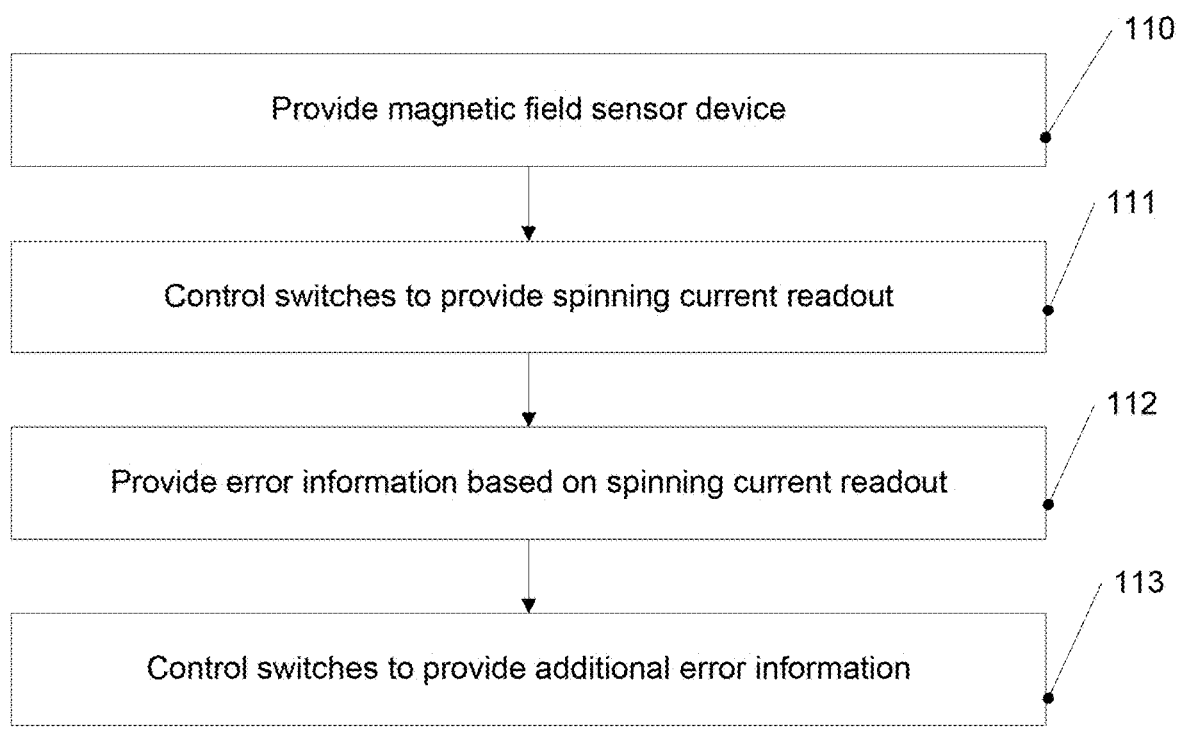
FIG. 11 is a flowchart illustrating a method according to one or more exemplary embodiments.

FIG. 11 is a flowchart illustrating a method according to an embodiment. While the method of FIG. 11 is illustrated as a series of acts or events, the order in which these acts or events are shown and described is not to be construed as limiting. For example, acts or events may be performed in a different order compared to the order shown, and/or some of the acts or events may be performed simultaneously, for example, using different parts of a circuit. The method of FIG. 11 may be implemented using any of the magnetic field sensor devices discussed previously, but is not limited thereto.

At 110 in FIG. 11, the method comprises providing a magnetic field sensor device. The magnetic field sensor device may comprise a magnetic field sensor associated with a plurality of switches. For example, the magnetic field sensor device may be a magnetic field sensor device as discussed above with reference to FIGS. 1-9.

At 111, switches of the magnetic field sensor device are controlled to provide a spinning current readout. At 112, error information is provided based on the spinning current readout. For example, partial sums as explained above may be formed and compared to each other, and/or an offset may be calculated.

At 113, the switches are controlled to provide additional error information. For example, switches in addition to those controlled at 111 may be controlled to inject an error current and/or to enable a measurement of a bias voltage or reference voltage, for example, as explained previously. It should be noted that in the embodiment of FIG. 11, in some cases either the actions associated with 111 or the actions associated with 113 may be omitted, thus providing only part of the error information.

The above embodiments serve merely as examples, and are not to be construed as limiting. Additional exemplary embodiments are provided below.

EMBODIMENTS

1. A device, comprising:
a magnetic field sensor,
a plurality of switches associated with the magnetic field sensor, and
a control circuit configured to control the plurality of switches and to provide at least one signal indicative of a fault based on operation of the switches.

2. The device of embodiment 1, wherein the control circuit is configured to control at least some of the plurality of switches to apply a spinning current scheme to the magnetic field sensor, the spinning current scheme comprising a plurality of phases where different terminals of the magnetic field sensor are used for biasing and for readout.

3. The device of embodiment 2, wherein the control circuit is configured to form at least two partial sums over readout results of the plurality of phases to provide the at least one signal.

4. The device of embodiment 3, wherein the control circuit is configured to provide a signal indicating an error in case a difference between two of the partial sums exceeds a predetermined threshold.

5. The device of any one of embodiments 2-4, wherein the control circuit is configured to obtain an offset based on readout results of the plurality of phases.

6. The device of any one of embodiments 1-5, wherein the control circuit is configured to control at least one of the plurality of switches to inject an error current to the magnetic field sensor, and further configured to evaluate correct operation of providing the at least one signal indicative of a fault based on the injected error current.

7. The device of any one of embodiments 1-6, wherein the control circuit is configured to control at least one of the plurality of switches to measure at least one of a bias current or a bias voltage biasing the magnetic field sensor.

8. The device of embodiment 7, comprising a first analog-to-digital converter configured to measure an output of the magnetic field sensor representative of a magnetic field, and a second analog-to-digital converter configured to measure the biasing current or biasing voltage.

9. The device of embodiment 7, comprising an analog-to-digital converter, the analog-to-digital converter being configured to measure an output signal of the magnetic field sensor indicative of a magnetic field and further being configured to measure the biasing current or biasing voltage.

10. The device of any one of embodiments 7-9, wherein at least one analog-to-digital converter of the device is further configured to measure at least one further quantity.

11. The device of any one of embodiments 1-10, further comprising an output to provide the at least one signal to a further entity to allow the further entity to determine a possible fault.

12. The device of any one of embodiments 1-11, wherein the device is an integrated device on a single chip.

13. The device of any one of embodiments 1-12, wherein the magnetic field sensor comprises a Hall sensor.

14. A magnetic field sensor device, comprising:
a magnetic field sensor, the magnetic field sensor comprising a plurality of terminals,
a biasing source,
at least one analog-to-digital converter,
a plurality of switches,
a controller, the controller being configured to control the plurality of switches to couple the biasing source and the analog-to-digital converter selectively with the plurality of terminals during a plurality of phases, and
a summing circuit to provide at least two partial sums over outputs of the analog-to-digital converter in different phases of the plurality of phases.

15. The device of embodiment 14, wherein the controller is further configured to evaluate a difference between the plurality of partial sums, and to output an error signal if the difference exceeds a threshold value.

16. The device of embodiment 14 or 15, wherein the controller is further configured to combine outputs of the analog-to-digital converter in different phases to determine an offset of the device.

17. A method, comprising:
providing a magnetic field sensor,
controlling switches associated with the magnetic field sensor, wherein controlling the switches comprises controlling at least some of the switches to provide a spinning current readout in a plurality of phases, and providing error information based on controlling the switches.

18. The method of embodiment 17, wherein providing error information comprises calculating at least two partial sums over the spinning current readouts, and evaluating a difference between the partial sums.

19. The method of embodiment 17 or 18, wherein providing error information comprises calculating an offset based on the spinning current readouts.

20. The method any one of embodiments 17-19, wherein controlling the switches comprises controlling at least some of the switches for at least one of providing additional error information, providing additional trimming measurements or providing additional diagnosis measurements.

Although features and elements are described above in particular combinations, one of ordinary skill in the art will appreciate that each feature or element can be used alone or in any combination with the other features and elements. In addition, the methods described herein may be implemented in a computer program, software, or firmware incorporated in a computer-readable medium for execution by a computer or processor. Examples of computer-readable media include electronic signals (transmitted over wired or wireless connections) and computer-readable storage media. Examples of computer-readable storage media include, but are not limited to, a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

What is claimed is:

1. A diagnostic device, comprising:
a magnetic field sensor comprising a plurality of terminals used for applying a measurement current and reading out a plurality of measurement signals based on a plurality of spinning current phases of a spinning current scheme;
a first plurality of switches associated with the magnetic field sensor, wherein the first plurality of switches are configured to change which of the plurality of terminals are used for applying the measurement current and which are used for reading out the plurality of measurement signals according to the spinning current scheme;
at least one current source configured to generate at least one error current;
a second plurality of switches coupled to the at least one current source and each switchably coupled to a different terminal of the plurality of terminals; and
a control circuit configured to control the first plurality of switches and the second plurality of switches according to the plurality of spinning current phases of the spinning current scheme,
wherein the control circuit is configured to control the second plurality of switches to inject the at least one error current into at least one of the plurality of terminals, and
wherein the control circuit is configured to receive the plurality of measurement signals, evaluate the plurality of measurement signals for an error corresponding to the at least one error current, and provide a signal indicative of a fault on a condition that the error is not detected.

2. The diagnostic device of claim 1, wherein, on a condition that the control circuit detects the error, the control circuit is configured to provide a signal indicative of no fault.

3. The diagnostic device of claim 1, further comprising:
a first current source configured to generate a first error current of the at least one error current;
a second current source configured to generate a second error current of the at least one error current; and
a third plurality of switches each coupled to a different one of the first current source and the second current source and each switchably coupled to the second plurality of switches,
wherein the control circuit is configured to control the third plurality of switches to inject the at least one error current into at least one of the plurality of terminals.

4. The diagnostic device of claim 1, further comprising: a conductor configured to carry the at least one error current; wherein the second plurality of switches are coupled to the at least one current source via the conductor.

5. The diagnostic device of claim 4, further comprising:
a first current source configured to generate a first error current of the at least one error current;
a second current source configured to generate a second error current of the at least one error current;
a third plurality of switches each coupled to a different one of the first current source and the second current source and each switchably coupled to the conductor,
wherein the control circuit is configured to control the third plurality of switches to inject the at least one error current into at least one of the plurality of terminals.

6. The diagnostic device of claim 1, wherein the control circuit is configured to determine a first average of a first set of the plurality of measurement signals, to determine a second average of a second set of the plurality of measurement signals, the second set of the plurality of measurement signals being different from the first set of the plurality of measurement signals, and to provide the signal indicative of the fault based on a comparison of the first average and the second average.

7. The diagnostic device of claim 6, wherein the first set of the plurality of measurement signals are read during a first set of adjacent spinning current phases and the second set of the plurality of measurement signals are read during a second set of adjacent spinning current phases.

8. The diagnostic device of claim 6, wherein the first average is an average of a sum of the first set of the plurality of measurement signals, and the second average is an average of a sum of the second set of the plurality of measurement signals.

9. The diagnostic device of claim 1, wherein the control circuit is configured to control at least some of the first plurality of switches to apply the spinning current scheme to the magnetic field sensor, the spinning current scheme comprising the plurality of spinning current phases where different terminals of the magnetic field sensor are used for biasing and for readout.

10. The diagnostic device of claim 1, further comprising:
an output to provide the at least one signal to a further entity to allow the further entity to determine a possible fault.

11. A magnetic field sensor device, comprising:
a magnetic field sensor, the magnetic field sensor comprising a plurality of terminals;
a biasing source;
at least one analog-to-digital converter configured to output a plurality of measurement signals;
a first plurality of switches configured to change which of the plurality of terminals are used for applying the biasing source and which are used for reading out the plurality of measurement signals according to a plurality of phases of a spinning current scheme;
at least one current source configured to generate at least one error current;

a second plurality of switches coupled to the at least one current source and each switchably coupled to a different terminal of the plurality of terminals;

a control circuit configured to control the first plurality of switches to couple the biasing source and the analog-to-digital converter selectively with the plurality of terminals during the plurality of phases of the spinning current scheme, and to control the second plurality of switches to inject the at least one error current into at least one of the plurality of terminals during at least one of the plurality of phases of the spinning current scheme, and wherein the control circuit is configured to receive the plurality of measurement signals, evaluate the plurality of measurement signals for an error corresponding to the at least one error current, and provide a signal indicative of a fault on a condition that the error is not detected.

12. The magnetic field sensor device of claim 11, wherein, on a condition that the control circuit detects the error, the control circuit is configured to provide a signal indicative of no fault.

13. The magnetic field sensor device of claim 11, further comprising:
a first current source configured to generate a first error current of the at least one error current;
a second current source configured to generate a second error current of the at least one error current; and
a third plurality of switches each coupled to a different one of the first current source and the second current source and each switchably coupled to the second plurality of switches,
wherein the control circuit is configured to control the third plurality of switches to inject the at least one error current into at least one of the plurality of terminals.

14. The magnetic field sensor device of claim 11, further comprising: a conductor configured to carry the at least one error current; wherein the second plurality of switches are coupled to the at least one current source via the conductor.

15. The magnetic field sensor device of claim 14, further comprising:
a first current source configured to generate a first error current of the at least one error current;
a second current source configured to generate a second error current of the at least one error current; and
a third plurality of switches each coupled to a different one of the first current source and the second current source and each switchably coupled to the conductor,
wherein the control circuit is configured to control the third plurality of switches to inject the at least one error current into at least one of the plurality of terminals.

16. The magnetic field sensor device of claim 11, wherein the control circuit is configured to determine a first average of a first set of the plurality of measurement signals, to determine a second average of a second set of the plurality of measurement signals, the second set of the plurality of measurement signals being different from the first set of the plurality of measurement signals, and to provide the signal indicative of the fault based on a comparison of the first average and the second average.

17. A diagnostic method, comprising:
providing a magnetic field sensor comprising a plurality of terminals used for applying a measurement current and reading out a plurality of measurement signals based on a plurality of phases of a spinning current scheme;
controlling a first plurality of switches associated with the magnetic field sensor, wherein the first plurality of switches are configured to change which of the plurality of terminals are used for applying the measurement current and which are used for reading out the plurality of measurement signals according to the spinning current scheme, wherein controlling the first plurality of switches comprises controlling at least some of the first plurality of switches to provide a spinning current readout of the plurality of measurement signals in a plurality of phases;
controlling a second plurality of switches coupled to at least one current source and each of the second plurality of switches being switchably coupled to a different terminal of the plurality of terminals, wherein the second plurality of switches are controlled to inject the at least one error current into at least one of the plurality of terminals to influence the measurement current;
evaluating the plurality of measurement signals for an error corresponding to the at least one error current; and
providing a signal indicative of a fault on a condition that the error is not detected.

18. The diagnostic method of claim 17, further comprising:
providing a signal indicative of no fault on a condition that the error is detected.

19. The diagnostic method of claim 17, further comprising:
determining a first average of a first set of the plurality of measurement signals;
determining a second average of a second set of the plurality of measurement signals, the second set of the plurality of measurement signals being different from the first set of the plurality of measurement signals;
generating a comparison result based on comparing the first average and the second average; and
providing error information based on the comparison result.

20. The diagnostic method of claim 19, further comprising
reading the first set of the plurality of measurement signals during a first set of adjacent spinning current phases; and
reading the second set of the plurality of measurement signals during a second set of adjacent spinning current phases;
wherein the first average is an average of a sum of the first set of the plurality of measurement signals, and the second average is an average of a sum of the second set of the plurality of measurement signals.

* * * * *